(12) United States Patent
Van Houdt

(10) Patent No.: US 6,486,509 B1
(45) Date of Patent: Nov. 26, 2002

(54) NON-VOLATILE MEMORY CELL

(75) Inventor: Jan Van Houdt, Bekkevoort (BE)

(73) Assignee: IMEC vzw, Leuven (BE)

( * ) Notice: Subject to any disclaimer, the term of this patent is extended or adjusted under 35 U.S.C. 154(b) by 0 days.

(21) Appl. No.: 09/530,614

(22) PCT Filed: Sep. 9, 1998

(86) PCT No.: PCT/BE98/00134

§ 371 (c)(1),
(2), (4) Date: Sep. 11, 2000

(87) PCT Pub. No.: WO99/13513

PCT Pub. Date: Mar. 18, 1999

Related U.S. Application Data
(60) Provisional application No. 60/058,279, filed on Sep. 9, 1997.

(30) Foreign Application Priority Data

May 14, 1998 (EP) .............................. 98870108

(51) Int. Cl.⁷ .............................. H01L 29/76
(52) U.S. Cl. .................. 257/319; 257/314; 257/315; 257/316
(58) Field of Search ................ 257/314, 321, 257/332, 296, 298, 326, 316, 317, 319, 320, 315, 318; 438/264, 263, 260, 197, 259, 257, 221, 222

(56) References Cited

U.S. PATENT DOCUMENTS

| | | | |
|---|---|---|---|
| 4,267,632 A | * | 5/1981 | Shappir |
| 4,462,090 A | * | 7/1984 | Iizuka |
| 4,851,370 A | * | 7/1989 | Doklan et al. |
| 5,111,270 A | * | 5/1992 | Tzeng |
| 5,151,761 A | * | 9/1992 | Takebuchi |
| 5,212,541 A | * | 5/1993 | Bergemont |
| 5,303,187 A | * | 4/1994 | Yu |

FOREIGN PATENT DOCUMENTS

| | | |
|---|---|---|
| EP | 0 326 465 A | 8/1989 |
| EP | 0 762 429 A | 3/1997 |
| WO | 94 15363 A | 7/1994 |

* cited by examiner

Primary Examiner—Nathan J. Flynn
Assistant Examiner—Kevin Quinto
(74) Attorney, Agent, or Firm—McDonnell Boehnen Hulbert & Berghoff

(57) ABSTRACT

The present invention is related to a non-volatile memory cell, comprising a semiconductor substrate including a source region and a drain region with a channel region there between; a floating gate of a conductive material at least partially extending over a first portion of said channel region; a control gate of a conductive material and at least partially extending over a second portion of the channel region; an additional program gate of a conductive material and at least partially overlapping said floating gate and being capacitively coupled through a dielectric layer to said floating gate.

2 Claims, 5 Drawing Sheets $Wp=0 \rightarrow 12.2F^2 = 1.5\mu m^2$ $Wp < 1.5F: 12.2F^2 + 3.5F*Wp = 1.5-2.1\mu m^2$ active area poly 1 floating gate poly 2 control gate poly 3 program gate

NON-VOLATILE MEMORY CELL

This application claims the benefit of Provisional application Ser. No. 60/058,279, filed Sep. 9, 1997.

FIELD OF THE INVENTION

The present invention relates to a fast-programmable Flash EEPROM (Electrically Erasable Programmable Read-Only Memory) device relying on the Source-Side Injection (SSI) mechanism for programming and that is particularly suited for high density low-voltage low-power applications.

BACKGROUND OF THE PRESENT INVENTION

Nowadays, most Flash memory cells integrated in or on an integrated circuit or chip use Channel Hot Electron Injection (CHEI) at the drain side of the memory cell, or Fowler-Nordheim Tunneling (FNT) for programming. The CHEI mechanism provides a relatively high programming speed (~10 μs) at the expense of a high power consumption (~1 mA/bit) which limits the number of transistor cells that can be programmed simultaneously (so-called page-mode programming) to a maximum of 8 bytes (Y. Miyawaki et al., IEEE J. Solid-State Circuits, vol.27, p.583, 1992). In order to allow a scaling of the transistor cell dimensions towards 0.35 μm and below, supply voltage scaling from 5V towards 3.3V and below becomes mandatory. This supply voltage scaling is known to degrade the CHEI efficiency, and hence the corresponding programming speed, considerably. This is because the high power needed to trigger the CHEI can not be easily supplied on-chip from a high voltage generator or charge pumping circuit.

On the other hand, FNT provides slower programming times (~100 μs) and a low power consumption which allows larger pages (~4 kbit) in order to reduce the effective programming time to 1 μs/byte (T. Tanaka et al., IEEE J. Solid-State Circuits, vol.29, p.1366, 1994). Improvements to this class of memory cells, however, are limited by tunnel-oxide scaling limits and by the very high voltages (~18V) needed on chip for FNT, both compromising reliability of the transistor memory cell and process scalability.

The recent success of SSI as a viable alternative over FNT and CHEI for Flash programming, is mainly due to its unique combination of moderate-to-low power consumption with very high programming speed at moderate voltages. A typical example of such a device relying on SSI for programming is the Applicant's High Injection Metal-Oxide-Semiconductor or HIMOS™ memory cell (J. Van Houdt et al., U.S. Pat. Nos. 5,583,810 and 5,583,811, and EP-A-0501941). A speed-optimised implementation of the HIMOS™ cell in a 0.7-μm CMOS technology exhibits a 400 nanoseconds programming time while consuming only a moderate current (~35 μA/cell) from a 5V supply. This result is obtained when biasing the device at the maximum gate current, i.e. at a control-gate voltage (Vcg) of 1.5 V. The corresponding cell area is in the order of 15 μm² for a 0.7-μm embedded Flash memory technology when implemented in a contactless virtual ground array as described in co-pending application EP-A-0762429. In terms of the feature size F (i.e. the smallest dimension on chip for a given technology), this corresponds to ~30F² for a 0.7-μm technology. This is fairly large as compared to the high density Flash memory concepts which are all in the ~10 F² range.

Due to the growing demand for higher memory density applications, also in embedded memory applications like e.g. smart-cards and embedded microcontrollers, a continuous increase in array density and the scaling of the supply voltage become mandatory. This evolution calls for more aggressive cell-area scaling and for low-voltage and low-power operation. In the co-pending application EP-A0762429, a novel programming scheme is described which reduces the power consumption during the write operation considerably. Also, the used write voltages are expected to scale with the supply voltage $V_{supply}$ since the SSI mechanism only requires the floating-gate channel to stay in the linear regime for fast programming (see e.g. J. Van Houdt et al., IEEE Trans. Electron Devices, vol.ED-40, p.2255, 1993). Therefore, the necessary Program-Gate voltage $V_{pg}$ for fast programming is given by:

$$V_{pg} \approx (V_{supply} + V_{th})/p \qquad (1)$$

where $V_{th}$ is the intrinsic threshold voltage of the floating gate transistor (~0.5V) and p is the coupling ratio from program gate to floating gate (typically ~50%). According to Eq. (1), $V_{pg}$ is thus expected to scale twice as fast as the supply voltage in a first order calculation. It can be concluded that the high programming voltage is scaling very well with the supply voltage which offers enough margin in order for the high voltage circuitry to follow the minimum design rule. There is, however, the drawback of the additional program gate in the HIMOS concept which increases the cell area considerably in the case of a double polysilicon technology. Furthermore, since both control gate and program gate are formed in the same (second) polysilicon layer, the process requires special polysilicon etching recipes in order to remove the polysilicon stringers between control gate and program gate.

AIMS OF THE PRESENT INVENTION

It is an aim of the present invention to suggest a flash memory cell structure that reconciles the possibility for having a small cell size with a high degree of CMOS compatibility.

Thus, the present invention aims to reach a very compact, though still CMOS-compatible, cell geometry that paves the way to higher density low-voltage applications.

More particularly, the present invention aims to suggest a cell allowing for a high integration density without considerably affecting the basic CMOS process, therefore rendering it into a highly competitive memory technology with a low development entry cost, especially in the deep-submicron range.

BRIEF SUMMARY OF THE INVENTION

A first object of the present invention is a non-volatile memory cell comprising a semiconductor substrate including a source region and a drain region with a channel region therebetween; a floating gate of a conductive material at least partially extending over a first portion of said channel region; a control gate of a conductive material at least partially extending over a second portion of the channel region; an additional program gate of a conductive material region at least partially overlapping said floating gate and preferably said control gate being capacitively coupled through a dielectric layer to said floating gate.

According to a first preferred embodiment, the control gate is partially overlapping through a (thin) polyoxide layer the floating gate.

According to a second preferred embodiment, the floating gate is partially overlapping through a (thin) polyoxide layer the control gate.

A second object of the present invention is to suggest a method of fabricating a non-volatile memory cell, preferably as described hereabove, wherein on a substrate including a source region and a drain region with a channel region therebetween, at least:

- a first polysilicon layer is deposited and selectively removed in order to form at least a part of either a floating gate or a control gate at least partially extending over a portion of said channel region,
- a second polysilicon layer is deposited and selectively removed in order to form either a control gate or a floating gate extending over the complementary portion of the channel region and partially overlapping said first polysilicon layer,
- a third polysilicon layer is deposited and selectively removed in order to form a program gate at least partially overlapping at least one of the two first polysilicon layers.

According to a preferred embodiment, a first interpoly dielectric layer is formed between the first and second polysilicon layers.

According to another preferred embodiment, a high quality dielectric is formed on the top of the two first polysilicon layers before depositing the third polysilicon layer.

A third object of the present invention is to suggest a contacted array configuration of non-volatile memory cells as described hereabove.

A fourth object of the present invention is to suggest a contactless array configuration of non-volatile memory cells as described hereabove.

The term "supply voltage" as used throughout the specification is well understood by one of ordinary skill in the art. The term "supply voltage" is meant to be any external voltage that delivers the power to make an electronic circuit operate. By preference, the "supply voltage", of a chip including non-volatile memory cells is the voltage used to supply the power to any logic circuit fabricated in the CMOS technology in which the non-volatile memory cells are incorporated. For the 0.7 $\mu$m non-volatile memory technology as disclosed in this and related applications, the supply voltage is 5 Volt. Any externally applied voltage other than the supply voltage defined above will be referred to herein as an "external voltage".

A voltage that is outside the range between the supply voltage and ground and that only needs to deliver a limited amount of current can be generated without the need for an external voltage. Such voltage is referred to as an on-chip generated voltage and can be generated by charge pumps incorporated on the chip.

Throughout the specification, also the terms low voltage, moderate voltage and high voltage may be used. A low voltage is meant to be a voltage that in absolute value is smaller than or equal to the supply voltage ($|V| \leq V_{cc}$). A moderate voltage is a voltage that in absolute value is higher than or equal to the supply voltage but is smaller than or equal to the double of the supply voltage ($V_{cc} \leq |V| \leq V_{cc}$). A high voltage is a voltage that in absolute value is higher than 2 $V_{cc}$ ($|V| \geq 2 V_{cc}$).

The objects, features and advantages of the present invention are discussed or apparent in the following description.

DETAILED DESCRIPTION OF SEVERAL EMBODIMENTS DESCRIBED IN THE PRIOR ART

USING 3 POLYSILICON LAYERS IN FLASH MEMORY CELLS

Figure 1A:
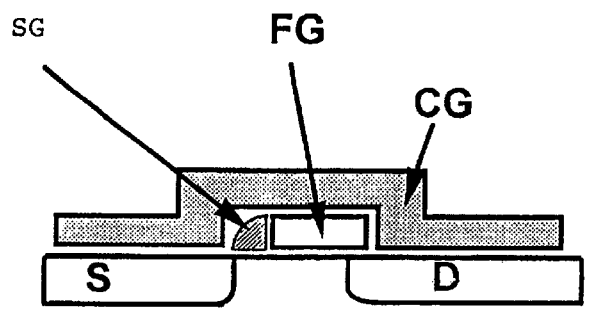
FIGS. 1a and 1b show typical flash memory cell sidewall-gate structures of the prior art.
Figure 1B:
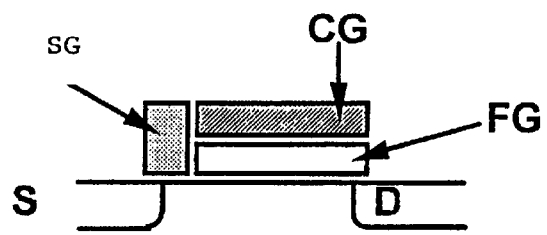

FIGS. 1a to 1d represent several embodiments of high-density high-performance Flash memory devices using 3 polysilicon layers according to the prior art. References to such devices that are relevant with respect to the present invention are described hereunder:

(1) U.S. Pat. No. 5,284,784, issued Feb. 8th 1994, to Martin H. Manley
(2) U.S. Pat. No. 5,091,882, issued Feb. 25th, 1992, to K. Naruke
(3) U.S. Pat. No. 4,794,565, issued Dec. 27th, 1988, to A. T. Wu et al.
(4) U.S. Pat. No. 5,235,544, issued Aug. 10th, 1993, to J. Caywood.
(5) U.S. Pat. No. 5,338,952, issued Aug. 16th, 1994, to Y. Yamauchi
(6) U.S Pat. No. 5,280,446, issued Jan. 18, 1994, to Y. Y. Ma et al.
(7) U.S. Pat. No. 5,394,360, issued Feb. 28th, 1995, to T. Fukumoto In contrast to the invention described below, these references all suffer from a number of significant disadvantages that are discussed now in more detail.

The first four referenced patents (Manley, Naruke, Wu and Caywood) all describe so-called "sidewall gate" devices as represented in FIG. 1. In each of these devices, the floating gate (FG) is formed in the first polysilicon layer, while the select gate (SG) is formed by a polysilicon sidewall spacer. This spacer can be formed in the second polysilicon layer (Manley as represented in FIG. 1a) or in the third one (Wu, Naruke, Caywood as represented in FIG. 1b). The main disadvantages associated with these sidewall-gate devices are listed below:

(1) the sidewall select gate is formed by depositing a polysilicon layer on the chip which is then removed selectively by using anisotropic (dry) etching techniques. It is, however, very difficult to control this selective etching operation. For example, the width of the spacer remaining after etching determines the effective channel length during programming and this parameter should be tightly controlled. Therefore, this technique is not to be considered as a standard process step for CMOS. Also, after this anisotropic etch, the remaining sidewall is not only present on the source side of the device, but it will be a ring around the first (and eventually also the second) polysilicon gate(s). To correct for this, an additional photo step is required.
(2) Since the select gate controls a short portion of the channel, it needs to switch off the transistor channel in some cases, e.g. when reading/writing a particular cell the select gates of the (erased) cells sharing the same bitline have to be able to reduce their channel current to zero in order to prevent leakage currents and/or unwanted programming in the array. Usually, the thickness of the polysilicon—which determines the width of the spacer—is smaller than the minimum feature size, which compromises the hard-off situation which is highly desired in a memory array.
(3) It is well known that the efficiency of the SSI mechanism is closely linked to the thickness of the oxide spacing in between the select gate and the floating gate (see e.g. J. Van Houdt et al., IEEE Transactions on Electron Devices, vol.39, no.5, May 1992). By putting the sidewall right next to the control gate (Wu, Naruke, Caywood), this oxide spacing has to remain fairly thick since it also has to isolate the high control gate voltage during programming from this sidewall gate. Therefore, the injection efficiency is compromised by isolation requirements.
(4) Also, since the part of the transistor channel which is controlled by the sidewall gate is much shorter than the part controlled by the floating gate, a larger portion of the external drain voltage will be lost for the channel hot-electron generation at the injection point.
(5) The main problem with these devices, however, is the difficulty for contacting the cells in a large array of memory cells. Indeed, the sidewall gate is also used for wiring and this has a considerable negative impact on the parasitic resistance in a large memory array, as explained in U.S. Pat. No. 5,394,360.

Figure 1C:
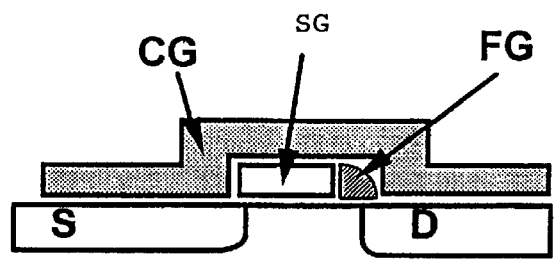
FIG. 1c shows an alternative flash memory cell sidewall-gate structure where the sidewall serves as the floating gate also belonging to the prior art.

The 5th reference (U.S. Pat. No. 5,338,952, issued Aug. 16th, 1994, to Y. Yamauchi) removes some of the problems mentioned above by forming the floating gate (FG) as a polysilicon sidewall spacer (FIG. 1c). However, some drawbacks of the sidewall-gate device are still present in this memory cell:

(1) The sidewall select gate (SG) is still formed by depositing a polysilicon layer on the chip which is then removed selectively by using anisotropic (dry) etching techniques. In this case, the width of the spacer remaining after etching determines the effective channel length during read-out and this parameter should be tightly controlled. Indeed, if electrons are stored on the floating sidewall gate, the portion of the channel controlled by this sidewall has to be switched off efficiently, which is not evident. As already mentioned above, the thickness of the polysilicon—which determines the width of the spacer—is usually smaller than the minimum feature size, which compromises the hard-off situation which is highly desired in a memory array. Eventually, the cell may exhibit a soft-on and a hard-on state instead of hard-off/hard-on states as required for fast access. Furthermore, since erasing is now to be achieved from the sidewall towards a sufficiently underdiffused drain junction, the effective channel controlled by the spacer is even smaller. This makes the leakage problem during read-out even more critical.
(2) As in the previous cases, after the anisotropic etch, the remaining sidewall is not only present on the drain side of the device, but it will be a ring around the select gate. To correct for this, an additional photo step is required.
(3) Since the floating gate is a sidewall spacer, the coupling ratio between the control gate (third polysilicon) and this floating gate will be rather small. Indeed, referring to U.S. Pat. No. 5,338,952 (FIG. 1), it is clear that the coupling from the floating sidewall gate towards control gate, substrate/drain and select gate are in the same order of magnitude. This implies that the high programming voltage is still 12V in a 0.5 $\mu$m CMOS technology (see the corresponding conference paper "A 5V-only virtual ground Flash cell with an auxiliary gate for high density and high speed applications", by Y. Yamauchi et al., IEDM Tech. Dig., p.319, 1991). Consequently, also the voltage difference between the control gate and the select (or auxiliary) gate exceeds 10V during programming which compromises the scaling of the second interpoly layer (layer 12 in FIG. 1 of the discussed application). Thus, this dielectric layer will have to remain relatively thick (200 Å according to the application (col.4, line 46). This will further decrease the coupling ratio between control gate and floating gate, since the oxide between the sidewall and the select gate has to scale because of its impact on the source-side injection efficiency (see above). The only solution is to increase the coupling ratio by adding coupling area (so-called wings) between control gate and floating gate. This solution, however, compromises the major advantage of this cell which is its high integration density.
(4) Also, the erase voltage is still very high (−11V according to the application) which makes the concept unsuited for embedded memory applications where these high negative voltages would introduce too high an additional processing cost. This high erase voltage is again, a consequence of the fairly low coupling ratio towards the sidewall gate.

Figure 1D:
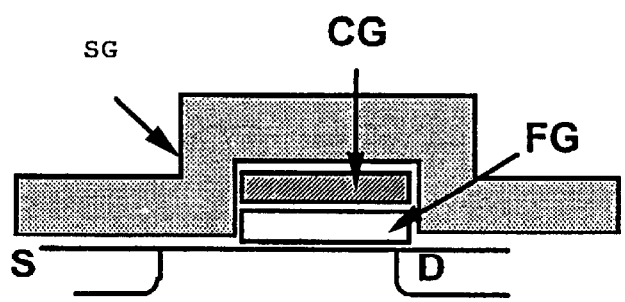
FIG. 1d shows a flash memory cell split-gate structure employing three polysilicon layers (prior art).

FIG. 1d discloses an alternative memory cell with 3 polysilicon layers, which also uses the source-side injection mechanism as described in U.S. Pat. No. 5,280,446. The major difference with the previously discussed prior art is the absence of a sidewall gate. Instead, first and second poly are etched in a stacked way and the select gate (SG) is added on top by a third polysilicon layer. Some major disadvantages are given hereafter:

(1) It is well-known to anyone skilled in the art that such a processing scheme introduces considerable complexity which makes it impossible to use in an embedded memory application.
(2) On the other hand, the used erase voltage is still −12 V provided that the bitline is biased at 5 V. In future generations (when the supply voltage and hence also the bitline voltage go down), aggressive tunnel oxide scaling will be required in order not to have an increase in this negative voltage.
(3) The oxide spacing between the select gate (SG) and the control gate (CG) has to be kept quite thick because this oxide also serves to isolate the high programming voltage from the select gate in order not to have an oxide breakdown event during programming. This restriction compromises scaling—in general—and also—more in particular—decreases the injection efficiency which is directly linked to the thickness of this spacing as explained extensively by J. Van Houdt et al. in IEEE Transactions on Electron Devices, vol.39, no.5, May 1992.

Figure 2:
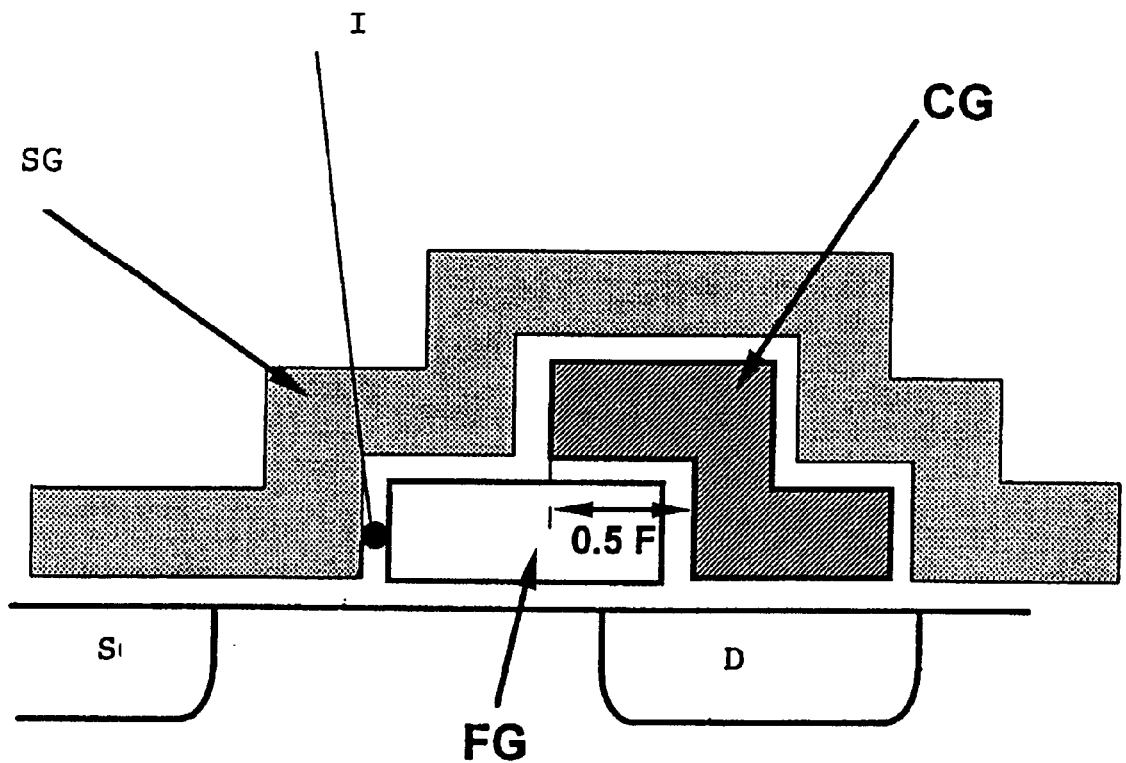
FIG. 2 shows a cross-section of a flash memory cell described in the prior art wherein the conflicting requirements for the second interpoly dielectric layer are indicated.

U.S. Pat. No. 5,394,360, issued Feb. 28th, 1995, to T. Fukumoto, describes several embodiments of source-side injection cells. The embodiment disclosed in FIG. 2 of the above-mentioned patent suffers from the same disadvantages as the device described by Ma et al. (see above). The second embodiment (FIG. 4 of said patent) and described in FIG. 2 removes the first 2 arguments, but the (major) third drawback is still valid:

the dielectric which determines the injection efficiency used for the spacing between select gate (SG) and control gate (CG) also has to provide sufficient isolation (I) between the high programming voltage (second polysilicon) and the (low) select gate (SG) voltage during programming (third polysilicon). When taking the numbers from said embodiment, the control gate (CG) will be pulsed to 14–15 V and the select gate (SG) is biased at 1.5 V during programming (col.2, lines 59–64). This implies that the second interpoly dielectric is subject to a stress of 12.5–13.5 V. Obviously, this layer can not be made very thin and, hence, the injection efficiency will be compromised since the same layer is also serving as the spacing oxide (I) between select gate (SG) and floating gate (FG).

A second problem with said cell is the following: the second poly-silicon control gate (CG) should cover most of the floating gate (FG) in order to increase the coupling ratio and hence reduce the programming voltage. On the other hand, this overlap is limited due to design rules, since the "offset region" (col.1, line 59) has to be covered uniquely by the third polysilicon gate for having a functional cell. In practice, this layout rule will be about ½ of the feature size due to misalignment considerations (see FIG. 2). Since the floating gate has to be scaled as much as possible to minimize capacitive coupling ratios towards all terminals other than the control gate, its length will be ~F in an efficient cell design. This implies that only 50% of the floating gate area will actually contribute to the coupling ratio. The statement (col.3, lines 34–37) that "the second gate electrode is provided so as not to enter (overlap) the offset region and to be directly capacitively-coupled with the whole surface of the floating gate" is, therefore, a contradiction, since making sure that the second gate does not overlap the offset region implies that only part of the floating gate area contributes to the coupling ratio from control gate to floating gate. This explains why 14–15 V is still typically used for programming the cell.

DETAILED DESCRIPTION OF PREFERRED EMBODIMENTS OF THE PRESENT INVENTION

This description is detailing on a preferred embodiment of the cell of the present invention which is based on a cell concept as described in U.S. Pat. Nos. 5,583,810 and 5,583,811 and named the HIMOS™ cell. Such cell has three separated gates formed in two polysilicon layers:

the control gate which is formed in the second polysilicon layer and which controls the first part of the channel extending from the source junction to the point where the enhanced hot-electron injection occurs. This point is further referred to as the "split point";

the floating gate which is formed in the first polysilicon layer and which controls the second part of the channel extending from the split point to the drain junction, and which serves to collect electrons during the programming operation;

the program gate which is formed in the second polysilicon layer and which is capacitively coupled to the floating gate extension which is present outside of the active transistor region.

Said HIMOS™ cell takes at least about 30 $F^2$ in a 0.7-$\mu$m double polysilicon CMOS process. This is considerably larger than state-of-the-art stand-alone memory technologies. Therefore, the application of the HIMOS™ concept may be limited to embedded memory with low-to-medium density requirements. In order to meet the increasing demand for high density embedded as well as stand-alone memories, another cell geometry is therefore required. The main reason for this larger cell size is the need to form two gates in the same polysilicon layer, i.e. the control gate (CG) and the program gate (PG). These two gates have laterally isolated edges which increase the cell size considerably with respect to other cell concepts that only use two gates (floating gate and control gate) at the expense of a lower performance. Secondly, the double polysilicon version suffers from a technological problem when scaling down to very thin gate oxides: the second polysilicon layer has to be overetched in order to remove the stringers that would otherwise stay behind at the edges of the first polysilicon layer. For very thin gate oxides, this becomes more difficult to achieve since the overetch step may not stop on this thin oxide and damage the silicon surface. This problem is a direct consequence of the two gates inside the cell which are to be formed in the same polysilicon layer. The problem can be removed by adding a third mask to selectively remove these stringers, but this introduces an additional processing cost.

For the above-mentioned reasons, a triple polysilicon version becomes highly attractive since a higher density is obtained for the same mask count.

Figure 3:
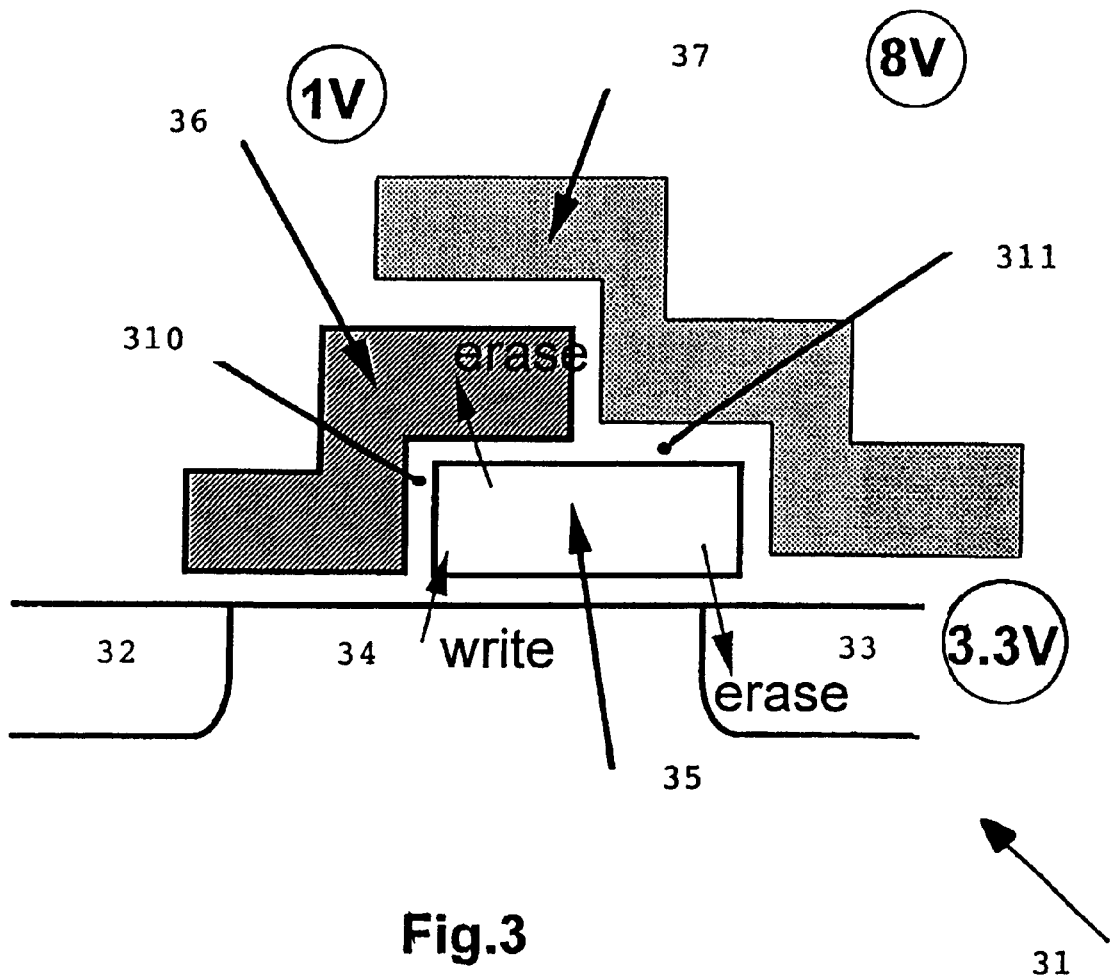
FIG. 3 shows a first embodiment of a flash memory cell according to the present invention showing the cross-section of the cell in case the first polysilicon layer is used for the floating gate.
Figure 4:
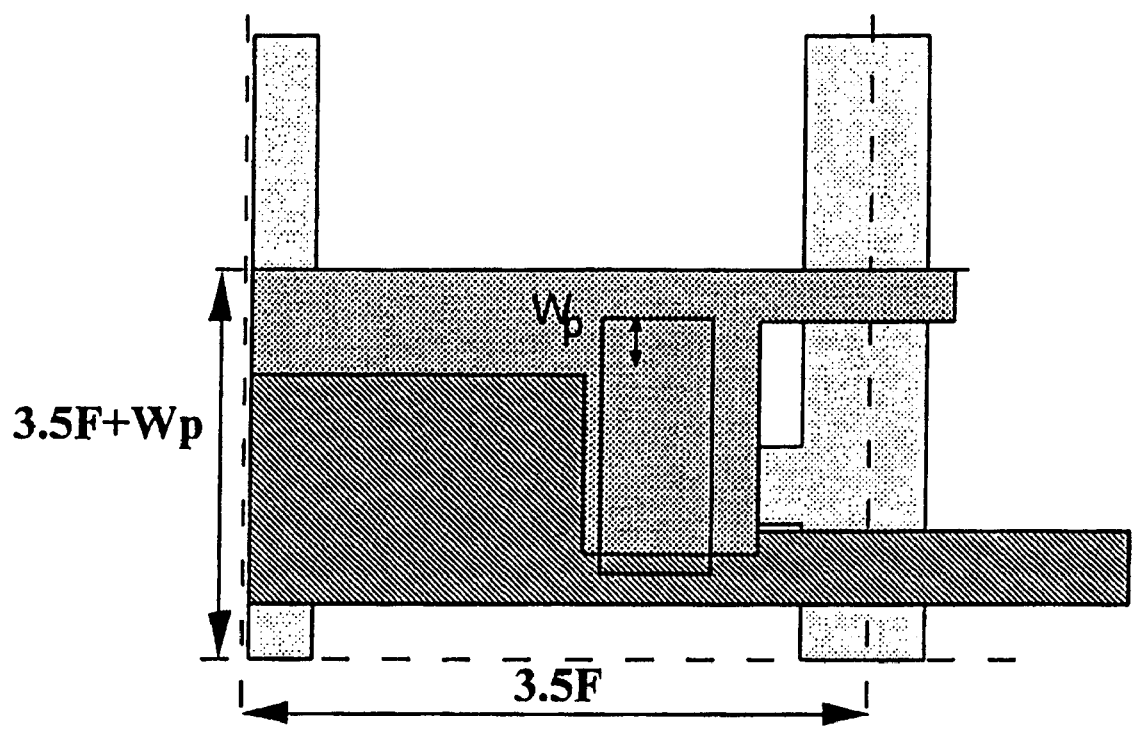
FIG. 4 shows a typical cell layout for the triple polysilicon device shown in FIG. 3.
Figure 4:
Figure 4:
Figure 4:
Figure 4:

A first embodiment of the present invention is shown in FIGS. 3 and 4. According to the cross-section in FIG. 3, the floating gate 35 is formed in the first polysilicon layer, the control gate 36 is formed in the second polysilicon layer and the program gate 37 is formed on top of the split-gate structure using a third polysilicon layer.

This cell geometry employs three layers of polysilicon which enables a considerable reduction of the HIMOS™ cell size down to 15 $F^2$ and below. All erase and programming schemes shown in the related patent applications are compatible with this device structure as well as with the device structure disclosed in Applicant's U.S. Pat. No. 5,583,811

An exemplary processing scheme is described hereafter: After growing a thin oxide (typically 70 Å for a 0.35 $\mu$m CMOS technology) on the substrate 31, a first polysilicon layer is deposited and etched to form the floating gate 35 of the memory cells. If Fowler-Nordheim tunneling towards the drain is chosen as the erase mechanism, a junction is formed by an n$^+$ implantation (preferably combined Phosphorous/Arsenicum junction) which is self-aligned with respect to the floating gate 35 on the drain side 33 of the memory cell transistor. The source junction could be formed by the same implantation step, i.e. in a non-self-aligned manner, or, alternatively, it can also be formed together with the CMOS junctions (after second polysilicon definition). Afterwards, a thin oxide (typically less than 120 Å) is grown on the complementary part of the substrate and simultaneously a thin polyoxide 310 is formed on the top and the sidewall of the floating gate 35. Depending on the oxidation conditions and the doping level of the floating gate 35, this interpoly oxide 310 can be either very thin (e.g. 120 Å if the oxide on the substrate is 70 Å) or fairly thick (e.g. upto 300 Å for higher reliability). However, to optimize the source-side injection efficiency during programming, this interpoly oxide 310 should preferably be as thin as possible (see e.g. J. Van Houdt et al. in IEEE Transactions on Electron Devices, vol.39, no.5, May 1992). In practice, the thickness of this (first) interpoly layer is determined by a compromise between programming efficiency and oxide reliability. Then, a second polysilicon layer is deposited and etched to form the control gate (or select gate) 36 of the memory cell. At this point, the junctions of the CMOS process are formed which can, eventually, be combined with the source junctions of the memory cells, as explained above. This cell can still be erased through FN tunneling or through polyoxide conduction as described in the related patents and patent applications EP-A-0501941 and EP-A-0762429. Note that the polyoxide erase option does not require the additional drain junction implant after the first polysilicon definition. The cell architecture is finalized by the formation of a high quality dielectric 311 on top of the double polysilicon split-gate structure. This layer can be either a thermally grown polyoxide which is tuned for high reliability, or a deposited dielectric layer such as e.g. a composite Oxide-Nitride-Oxide (ONO) layer. Afterwards, a third polysilicon layer is deposited and selectively removed in the CMOS part and between the different memory blocks that are sharing the same program line. Such blocks are preferably equal to—at the least—two wordlines as explained in the applicant's co-pending EP-A-0762429, while the maximum number of shared wordlines is determined by the sector size. Alternatively, the CMOS junctions could also be defined after the third polysilicon definition, in order to avoid the presence of spacers in between the floating gate and the program gate. Finally, it is important to note that the stringer removal is no longer critical, since eventual residues of the second polysilicon layer besides the floating gate edges can not cause a leakage between different nodes of the cell nor between different cells in the array. The stringer formed during the third polysilicon definition has to be removed selectively, but this is easier because it only appears on the field oxide region where longer overetching recipes are less critical.

The cell of the preferred embodiment of the present invention is considerably smaller than the HIMOS™ cell disclosed in U.S. Pat. No. 5,583,811, since the program gate is now placed on top of the split-gate transistor which removes the above-mentioned area penalty. The third polysilicon is merely added to be able to put the Program Gate on top of the split-gate structure instead of beside it. Typical programming voltages in a 0.35 μm technology are also indicated in a circle on FIG. 3: the control gate bias is around 1 V, while the program gate is provided with 8 or 9 V from a charge pumping circuit that is provided on chip with the flash memory cell. The drain is biased at 3.3 V, which is the supply voltage. This brings the floating gate to a potential of about 4 V which is sufficient to efficiently trigger the SSI mechanism. During erase, the gates are biased negatively (around –6 V) while the drain is at 3.3 V in case of the drain erase scheme. For the polyoxide erase scheme, 5 V is applied to the CG and –5V or –4 V to the PG while the bitlines are kept grounded. Read-out is accomplished by applying small voltages to CG and drain while the PG is grounded.

As compared to the prior art described hereabove, the presented device architecture also implies:

that no sidewall spacers are required, thus removing all the corresponding disadvantages as discussed in detail in the prior art section;

that no stacked etch of poly layers is required and most importantly, that the high programming voltage can be isolated from the split-gate structure by a separate layer which is entirely decoupled from the injection mechanism.

Starting from the assumption that a third poly mask is necessary anyway (even if only 2 polysilicon layers are being used, see above), the additional cost for processing the device of FIG. 3 is relatively small:

(1) a second interpoly layer between second and third polysilicon is to be introduced, preferably a high quality composite ONO layer, which has to isolate the high programming voltage from the split-gate structure.

(2) a third polysilicon layer has to be introduced.

FIG. 4 shows the corresponding layout for a virtual ground array. Depending on the required coupling ratio between program gate and floating gate, the cell size is somewhere between 1.5 and 2.1 μm² in a 0.35 μm technology. Another interesting feature of the device is that the program line which connects the program gates of all cells on the same row can now easily be shared between more than 2 lines in contrast to the double polysilicon version (as described in detail in U.S. Pat. No. 5,583,811 and co-pending application EP-A-0762429). This removes a "new" stringer problem which would otherwise appear due to the etching of the third polysilicon layer, and allows an even higher integration density. The associated disturb effects will be limited because of the high quality dielectric between the second and third polysilicon layer.

Figure 5:
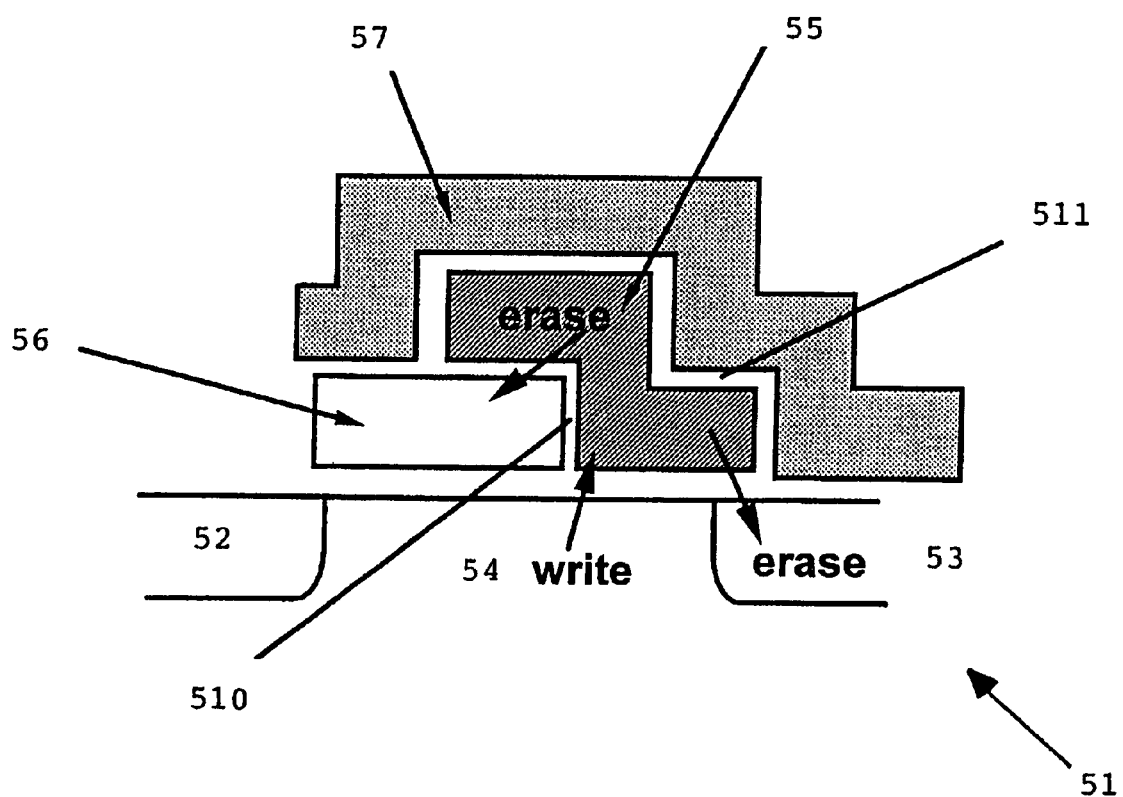
FIG. 5 shows a second embodiment of a flash memory cell according to the present invention showing the cross-section of the cell in case the second polysilicon layer is used for the floating gate.

FIG. 5 shows an alternative embodiment of the cell of the invention in which the role of the first two polysilicon layers have been switched.

An exemplary processing scheme is described hereafter: after growing a thin oxide on the substrate 51 (typically less than 120 Å for a 0.35 μm CMOS technology), a first polysilicon layer is deposited and etched to form the control gates (or select gates) 56 of the memory cells. Afterwards, a thin oxide 510 (typically about 70 Å) is grown on the complementary part of the substrate and simultaneously a thin polyoxide is formed on the top and the sidewall of the control gate. Depending on the oxidation conditions and the doping level of the control gate, this interpoly oxide 510 can be either very thin (e.g. 120 Å if the oxide on the substrate is 70 Å) or fairly thick (e.g. upto 300 Å for higher reliability). However, to optimize the source-side 52 injection efficiency during programming, the interpoly oxide 510 should preferably be as thin as possible (see e.g. J. Van Houdt et al. in IEEE Transactions on Electron Devices, vol.39, no.5, May 1992). In practice, the thickness of this (first) interpoly layer is determined by a compromise between programming efficiency and oxide reliability. Then, a second polysilicon layer is deposited and etched to form the floating gates 55 of the memory cells. If Fowler-Nordheim tunneling towards the drain is chosen as the erase mechanism, a special junction is formed by an n⁺ implantation (preferably combined Phosphorous/Arsenicum junction) which is self-aligned with respect to the floating gate 55 on the drain side 53 of the device. The source junction 52 could be formed by the same implantation step, i.e. self-aligned to the control gate 56, or, alternatively, it can also be formed together with the CMOS junctions. This cell can still be erased through FN tunneling or through polyoxide conduction as described in the related patents and patent applications. Note that the polyoxide erase option does not require the additional drain junction implant after the second polysilicon definition. The cell architecture is finalized by the formation of a high quality dielectric on top of the double polysilicon split-gate structure. This layer can be either a thermally grown polyoxide which is tuned for high reliability, or a deposited dielectric layer 511 such as e.g. a composite Oxide-Nitride-Oxide (ONO) layer. Afterwards, a third polysilicon layer is deposited and selectively removed in the CMOS part and between the different memory blocks that are sharing the same program line 57. Such blocks are preferably equal to—at the least—two wordlines as explained in the applicant's co-pending application EP-A-0762429, while the maximum number of shared wordlines is determined by the sector size. Alternatively, the CMOS junctions could also be defined after the third polysilicon definition, in order to avoid the presence of spacers in between the floating gate and the program gate. Finally, it should be mentioned that the stringer removal is again critical, since eventual residues of the second polysilicon layer besides the control gate edges can cause a leakage between different cells. Therefore, an adapted polysilicon etching recipe is required. The stringer formed during the third polysilicon definition also has to be removed selectively, but this is easier because it only appears on the field oxide region where longer overetching recipes are less critical.

The major advantage is that the entire floating gate area including the three upright edges of the floating gate are contributing to the coupling ratio between floating gate and program gate. Therefore, the minimum-size cell according to the layout rules (about 15 $F^2$) still exhibits a high coupling ratio in the order of 60% (the layout of FIG. 4 remains valid if simply reversing first and second polysilicon gate in the legend). This embodiment is only interesting in the case where three polysilicon layers are used, because of the overlaps which increase the coupling ratio between second and third polysilicon layer considerably. The contribution of these overlaps is becoming increasingly important because the lateral dimensions are more and more approaching the vertical ones (e.g. in a 0.7 $\mu$m technology, the polysilicon thickness is about 300 nm or <0.5 F while in a 0.25 $\mu$m technology it is still 200 nm or F). In the case of a double polysilicon version—as described in Applicant's U.S. Pat. No. 5,583,811—reversing the role of the polysilicon layers is not at all favorable because it removes all overlap capacitances from the gate coupling ratio, therefore reducing the coupling ratio for the same cell area considerably.

Apart from this major area advantage—which is also solving the second problem with respect to the Fukumoto cell (see prior art section)—there are some minor differences between both embodiments:

(1) In the case of FIG. 3, the stringer problem is entirely removed, while in the case of FIG. 5 the removal of stringers is still necessary for reliable operation in a memory array. In the case of FIG. 5 the first polysilicon layer is used also for the wordline routing, which means that the stringer will 'follow' this line eventually short-circuiting the different floating gates on a given wordline. This can be avoided by adopting a dedicated etching recipe for both the first and the second polysilicon gates.

(2) The polyoxide erase option as described in Applicant's U.S. Pat. No. 5,583,810 and in the co-pending application EP-A-0762429, is still applicable, but will be somewhat less efficient due to the fact that the tunneling now has to occur from second to first polysilicon.

The presented solutions are different from the original double polysilicon version as described in Applicant's U.S. Pat. No. 5,583,811, without however excluding any of the operational modes described in Applicant's U.S. Pat. No. 5,583,810, nor in the co-pending applications EP-A-0501941 and EP-A-0762429.

Preferred embodiments of the present invention have been described herein. It is to be understood, however, that changes and modifications can be made without departing from the true scope and spirit of the present invention. The true scope and spirit of the present invention are defined by the following claims, to be interpreted in light of the foregoing specification.

What is claimed is:

1. A contacted array configuration of non-volatile memory cells, each cell comprising:

a semiconductor substrate including a source region and a drain region with a channel region therebetween;

a floating gate of a conductive material at least partially extending over a first portion of said channel region;

a control gate of a conductive material at least partially extending over a second portion of the channel region; and an additional program gate of a conductive material at least partially overlapping said floating gate and being capacitively coupled through a dielectric layer to said floating gate, wherein at least a portion of the control gate is positioned between at least a portion of the floating gate and at least a portion of the channel.

2. A non-volatile memory cell according to claim 1, wherein at least a portion of the floating gate is positioned between at least a portion of the control gate and at least a portion of the program gate.

* * * * *